United States Patent [19]

Gracia et al.

[11] 4,391,897
[45] Jul. 5, 1983

[54] DIAZO LITHOGRAPHIC PRINTING PLATE DEVELOPING PROCESS

[75] Inventors: Robert F. Gracia, Scituate, Mass.; Howard A. Fromson, 15 Rogues Ridge Rd., Weston, Conn. 06880

[73] Assignee: Howard A. Fromson, Weston, Conn.

[21] Appl. No.: 274,341

[22] Filed: Jun. 17, 1981

Related U.S. Application Data

[63] Continuation-in-part of Ser. No. 85,146, Oct. 12, 1979, abandoned.

[51] Int. Cl.$^3$ .................................................. G03F 7/08
[52] U.S. Cl. ..................................... 430/302; 430/146; 430/175; 430/309; 430/331
[58] Field of Search ............... 430/302, 309, 331, 175, 430/146

[56] References Cited

U.S. PATENT DOCUMENTS

| | | | |
|---|---|---|---|
| 2,714,066 | 7/1955 | Jewett | 430/175 |
| 2,826,501 | 3/1958 | Hodgins | 430/175 |
| 3,091,533 | 5/1963 | Hodgins | 430/331 |
| 3,660,097 | 5/1972 | Mainthia | 430/175 |
| 3,669,660 | 6/1972 | Golda et al. | 430/331 |
| 3,751,257 | 8/1973 | Dahlman | 430/175 |
| 3,891,439 | 6/1975 | Katz et al. | |
| 4,186,006 | 1/1980 | Kobayashi et al. | 430/331 |

FOREIGN PATENT DOCUMENTS 548282  8/1950  Canada ............................... 430/309

Primary Examiner—Charles L. Bowers, Jr.
Attorney, Agent, or Firm—Felfe & Lynch

[57] ABSTRACT

Process for removing unexposed diazo from a silicated aluminum lithographic printing plate having a hydrophilic, anionic, negatively charged surface and a layer of a light sensitive, cationic diazo material which has been selectively exposed to actinic light in an image area. The plate is contacted after exposure with a solution of an anionic material in water. Anionic material from the solution ionically couples with unexposed diazo material and the solution still containing anionic material dissolves the coupled product from the unexposed areas producing a clean, hydrophilic background.

6 Claims, No Drawings

DIAZO LITHOGRAPHIC PRINTING PLATE DEVELOPING PROCESS

RELATED APPLICATIONS

This application is a continuation-in-part of copending application Ser. No. 85,146 filed Oct. 12, 1979, now abandoned.

BACKGROUND

This invention relates to an improved process for removing unexposed diazo material from an aluminum lithographic printing plate.

Lithographic printing techniques, using, for example, silicated aluminum plates as described in Jewett et al U.S. Pat. No. 2,714,066, or anodized and silicated aluminum plates as described in Fromson U.S. Pat. No. 3,181,461, are widely used in the printing industry.

A negative working plate is coated with an aqueous solution of a diazo resin, dried and normally exposed through a negative for 1 to 2 minutes. The exposed image areas become water insoluble and the unexposed non-image areas remain water soluble. The plate is conventionally developed with a lithographic lacquer which consists of a two-phase system, one phase containing an hydrophilic gum in water and the other an oleophilic resin in a solvent. Upon application, the oleophilic resin adheres to the exposed insoluble areas, while the water in the aqueous phase dissolves away the unexposed soluble non-image areas leaving a deposit of gum in the same areas. In this way, the image areas are made oleophilic or ink receptive and the gummed, non-image areas are made hydrophilic or ink repellent.

Silicated aluminum plates and silicated anodized aluminum plates (which can be pretreated to produce a grained surface) have been found to have a negatively charged surface which forms an ionic bond with a diazo resin which has an opposite, positive charge. While the unexposed, non-image portions of the diazo in theory remain water soluble, in practice it has been found that the dissolving power of water is insufficient to overcome the ionic bond. Thus, residual diazo remains in the non-image areas and the art has employed gum arabic to mask the residual diazo, which remains olephilic, to prevent scumming or ink pick-up in the non-image areas (also referred to as the background).

The presence of residual diazo in the background can be demonstrated by exposing a diazo coated silicated aluminum plate thru a negative, developing it with water and then re-exposing the plate thru the same negative turned ninety degrees. The twice exposed plate is again developed with water and then rubbed with press ink. The first image appears as well as a second, crossed image in the background of the first image. Ionically bonded diazo that remains in the background is responsible and, unless masked with gum arabic, will result in undesirable ink pick-up in the background long before the image wears.

The use of stronger solvents such as benzyl alcohol with water or by themselves has been proposed as well as coupling diazo resins with various materials to make them sparingly soluble in water and soluble in organic solvents (cf. U.S. Pat. Nos. 3,300,309 and 3,790,556). However, solvents are expensive and present serious disposal problems. The art has long sought a truly water-developable plate.

It has also been proposed to alter the surface characteristics of the aluminum plate to minimize or prevent ionic bonding by the diazo resin (cf U.S. Pat. No. 3,220,832) but this has drawbacks with respect to adhesion in the image areas.

While there are suggestions for using wetting agents in lithographic developers and lacquers, the art has avoided the use of anionic surfactants in diazo developers because it is known that a chemical reaction takes place (cf. U.S. Pat. No. 3,790,556) between a diazo and an anionic surfactant. The ink-loving reaction product is difficult to completely remove and unless it is masked with a water-loving substance such as gum arabic, its presence in the background will cause undesirable scumming or ink pick-up.

The present invention provides a developing system using an aqueous developer that removes the soluble light sensitive material completely. The invention also overcomes ecological problems by providing an aqueous system which can replace heretofore used organic solvent systems.

SUMMARY

The invention provides a process for removing unexposed diazonium material from an aluminum lithographic printing plate having a silicated aluminum substrate having a hydrophilic, anionic, negatively charged surface. A layer of a light sensitive, cationic, positively charged, water-soluble diazonium material is bonded to the silicated substrate. The plate is selectively exposed to actinic light in an image area and unexposed diazonium material is substantially completely removed leaving a clean, hydrophilic background on the plate by contacting the plate after exposure with a solution consisting essentially of an anionic material in water followed by rinsing with water. The aqueous solution of anionic material functions in two ways: first, anionic material couples (chemically reacts) with unexposed diazonium material and then, nearly simultaneously, the solution dissolves the coupled product to overcome the bond between the silicated substrate and the diazonium material. The ability of the solution of anionic material to dissolve the coupled product overcomes the affinity of the diazonium material for the substrate and ensures removal of unexposed material leaving a clean, hydrophilic background. The aqueous solution has a concentration of anionic material that is sufficient to couple with the unexposed diazonium material and dissolve the coupled product. Stated differently, the plate is contacted with an anionic material in water in a quantity and for a time sufficient to couple the anionic material with the diazo and dissolve the coupled product from the unexposed areas.

A plate developed according to the invention shows no second image in the background upon reexposure indicating substantially complete removal of diazo from the unexposed areas.

DESCRIPTION

Ionic development of diazonium light sensitive compounds depends on a chemical reaction between the positively charged (cationic) diazo material and a negatively charged (anionic) chemical entity in an aqueous ionizing medium. Upon formation, the reaction product precipitates and if and when the concentration of the anionic compound in the ionizing medium is high enough, instant or simultaneous redissolution of the reaction product occurs. In this way the reaction product is prevented from reprecipitating on the surface from which it was removed.

The determining variables in formulating a suitable developer are:
1. The anionic material
2. The cationic diazo material
3. Relative concentrations of both cationic diazo and the anion.
4. The volume of the aqueous anionic solution and its diffusion properties.
5. The temperature, which affects the rate reaction.
6. The pH
7. Physical agitation, which affects the micro chemical diffusion by renewing surfaces and homogenizing reaction gradients.

Suitable anionic materials are water soluble and include the alkali metal salts of alkylaryl sulfonates having 1 to 20 carbon atoms in the alkyl portion and 6 to 14 carbon atoms in the aryl portion, alkali metal salts of alkyl sulfonates having 12 to 20 carbon atoms and ammonium and alkali metal salts of sulfated higher fatty alcohols having 10 to 20 carbon atoms. Anionic materials used in the invention are usually dissolved in water and the concentration of the anionic material is sufficient to form an ionically coupled product with the light sensitive material and to dissolve the coupled product.

In more practical terms, it has been found that concentrations of anionic material of from 1 to 100% function satisfactorily with diazo materials coated on a substrate from solutions having a concentration of from 0.01 to 5%.

The rate of developing can also be accelerated by heating the developer to a temperature in the range of from 18° to 90° C., preferably from 22° to 60° C.

Specific examples of anionic materials are given herein together with a test to determine suitability. The effectiveness of certain anionic surfactants can be improved by adjusting the pH in the range of 2-10, preferably 2.5-9.

While a pH adjuster can be present, the presence of other materials such as cationic materials that will interfere with or prevent the coupling reaction between unexposed diazo and the anionic material in the non-image areas and subsequent dissolution of the coupled material in the non-image areas, must be avoided.

As described in copending application Ser. No. 85,145, filed Oct. 12, 1979, now U.S. Pat. No. 4,277,555, issued July 7, 1981, cationic dyes can be applied to the anionically charged substrate or incorporated in the light sensitive material to provide a visible image on the plate. Suitable dyes include basic cationic dyes such as Victoria Green, Rhodamine B, Rhodamine 5GLD, Crystal Violet, extra pure APN, Paper Blue R and the like.

Diazonium molecules are very strong cations and react instaneously with materials of the opposite charge, namely, anionic materials such as surfactants, dyes, polymers and the like. Thus, when an unexposed diazonium material is treated with an aqueous anionic solution such as sodium lauryl sulfate, in water, a coupling reaction between diazonium material and the anionic material takes place. It is thus believed that there is a two-step sequence, first the coupling reaction between the diazo and an anionic material followed by removal (by dissolution) of the coupled material in the background by the solution containing sufficient excess anionic material (after the coupling reaction) for dissolution.

Cationic light sensitive materials used in the invention are water-soluble diazonium materials having reactive sites capable of coupling with an anionic material. For example, 4-diazo diphenylamine condensed with a carbonyl compound such as formaldehyde is capable of coupling with an anionic material such as sodium lauryl sulfate. Such a condensed diazo compound further coupled with an aromatic compound such as the sulphonic acid of benzophenone to make it water insoluble cannot undergo coupling according to the invention. Suitable diazonium compounds are described, inter alia, in U.S. Pat. Nos. 2,063,631, 2,667,415, 2,677,498, 3,050,502, 3,311,605, 3,163,633, 3,406,159 and 3,227,074.

The silicated aluminum substrate can be a single sheet or a laminate and can be rigid or flexible. The preferred lithographic substrate is anodized aluminum which may be pretreated before anodizing to roughen or grain the surface, for example using mechanical, chemical or electrochemical techniques as are well know in the art and it may be post-treated after anodizing. It is preferred to impart hydrophilicity and anionic charge by silicating anodized aluminum as described in Fromson U.S. Pat. No. 3,181,461 or by silicating as described in Jewett et al. U.S. Pat. No. 2,714,066. The term "silicated aluminum" is thus used herein to describe silicated aluminum as per U.S. Pat. No. 2,714,066 and silicated anodized aluminum as per U.S. Pat. No. 3,181,461.

After treatment with the anionic material, the image can be reinforced with an oleophilic UV curable material which can be coated on and then cured. This is described in copending application Ser. No. 972,561, filed Dec. 22, 1978, which is incorporated herein by way of reference.

Suitable UV curable materials are commercially available from a number of sources in the form of UV curable inks, coatings, oligomers and monomers. Such commercially available materials can be obtained from the following companies: Inmont Corporation, Sinclair & Valentine, Celanese Chemical Company, 3-M Company, Desoto Chemical Company, Polymer Industries, Shell Chemical, Mobile Chemical, W. R. Grace, Design Coat Company, and Ware Chemical Corporation.

UV curable materials including monomers and oligomers are described in the following patents:
U.S. Pat. No. 3,297,745, 1967
U.S. Pat. No. 3,380,381, 1968
U.S. Pat. No. 3,673,140, 1972
U.S. Pat. No. 3,770,643, 1972
U.S. Pat. No. 3,712,871, 1973
U.S. Pat. No. 3,804,736, 1974

There are also materials that will cure upon exposure to other sources of radiation, for example an electron beam. These curable materials can be used in special applications in place of the UV material and are commercially available. Electron beam curable compositions are described in U.S. Pat. Nos. 3,586,526-30, 1971.

A test to determine whether a particular anionic material is suitable is as follows:

A 5% aqueous solution of the anionic material is prepared. An aluminum lithographic plate grained, anodized, and silicated is coated with a 1% solution of a light sensitive diazo condensation product (such as Fairmont's Chemical Diazo #4). The coated plate is exposed through a negative for a relatively short period of time 5 to 10 seconds. The exposed plate is immersed in the 5% solution of anionic material for 10 seconds. The plate is then rinsed thoroughly with water and dried. The plate is then turned ninety degrees and exposed a second time through the same negative. The twice exposed plate is then lacquered with a standard lithographic lacquer (such as Fairmont's Black Lacquer). If only a single image appears, the anionic material is suitable. If a double, crossed image appears, diazo is being left in the background of the first image which means the anionic material is probably unsuitable. However, higher concentrations should be tried before a final conclusion on suitability is drawn.

Many different salts of anionic materials are suitable; these include sodium, lithium, ammonium, or triethanol amine salts and the like. Examples of suitable anionic surfactants (and their commercial sources) are as follows:

1. Sodium lauryl sulfate (Proctor & Gamble, Equex S. Equex SP; Alcolac, Inc. Sipex SB).
2. Ammonium lauryl sulfate (Alcolac, Inc., Sipon L-22).
3. Sodium lauryl ether sulfate (Alcolac, Inc., Sipon ES).
4. Sodium dodecyl benzene sulfonate (Alcolac, Inc. Siponate DS-XO).
5. Ammonium lauryl ether sulfate (alcolac, Inc. Sipon EA).
6. Triethanolamine lauryl sulfate (Alcolac, Inc. Sipon LT-6).
7. Sodium alkyl sulfate (Alcolac, Inc., Sipex OLS).
8. Sodium stearate (Emery Inds.).
9. Sodium palmitate (Emory Inds.).
10. Sodium oleate (Matlerson, Coleman & Bell).
11. Dioctyl sodium sulfosuccinate (Cyanamid, Aerosol OT).
12. Tetrasodium N-Cl, 2-dicarboxyethyl 1)-N-octadecyl sulfosuccinate (Cyanamid, Aeroxyol 22).
13. Sodium Xylene sulfonate (Witco Chemical, Ultra SXS).
14. Sodium toluene sulfonate (Witco Chemical, Ultra STS).
15. Sodium cumene sulfonate (Witco Chemical, Ultra SCS hydrotrope).
16. Sodium dihexyl sulfosuccinate (Cyanamide Aerosol AY-65)
17. Sodium diamyl sulfosuccinate (Cyanamide Aerosol AY-65).
18. Anionic phosphate surfactant (Rohm & Haas Co., Triton QS-30).
19. Sodium alkylaryl polyether sulfate (Rohm & Haas Co., Triton W-30 conc.).
20. Phosphate surfactant, potassium salt (Rohm & Haas Co., Triton H-66).
21. Sodium alkylaryl polyether sulfonate (Rohm & Haas Co., Triton X-200).

Sodium lauryl sulfate is preferred because of its availability and cost.

It is preferred to overwhelm the exposed surface with aqueous anionic material to couple the diazo layer and dissolve the coupled product from the unexposed areas of the plate. This can be accomplished by immersion in the aqueous solution or by flooding the exposed surface by cascading or spraying. Rubbing by hand, normally employed with conventional developers is not necessary and should be avoided to prevent the creation of conditions under which the coupled product will come out of solution in the developer and deposit in the background. Uneven hand pressure can lead to this whereas uniform machine pressure applied via sponges or brushes can be tolerated.

EXAMPLE 1 (CONTROL)

A problem common to most lithographic plates coated with negative working condensation products of diazonium salts is failure to completely remove the unexposed diazo in nonimage areas. To illustrate: a brush grained, anodized, silicated plate is coated with a 3% solution of a water soluble diazo resin (Fairmont's Diazo Resin #4). The plate is exposed through a negative for 90 seconds with a Nu-arc flip-top unit to a solid 6 or 7 on a Stouffer Step Guide. After exposure the plate is immersed in running tap water, under yellow lights, for eight hours. The plate is then wiped, dried, and returned to the exposure unit. This time the negative is turned at right angle to the previously exposed image. The plate is reexposed for 90 seconds and developed using any available commercial developing lacquer. Upon development, it will be noted that two distinct image patterns exist on the plate. One from the first exposure and a second at a right angle to the first.

EXAMPLE 2 (CONTROL)

A brush grained, anodized, silicated plate is coated and exposed as in Example 1. The plate is developed with a commercial developing lacquer such as Western's Jet Black or Fairmont's Black lacquer. After developing, rinsing, and drying, the plate is reexposed with the negative turned at 90°. The plate when inked all over results in a double image.

EXAMPLE 3

A plate is coated and exposed as in Example 1. The plate is immersed in a 5% aqueous solution of sodium lauryl sulfate (SLS) for 10 seconds. The plate is then rinsed, dried, and reexposed as in Example 1. After the second exposure the plate is inked entirely. No second image results indicating that the background has been thoroughly cleaned, leaving no residual diazo.

EXAMPLE 4

A brush grained, anodized, silicated plate is coated with a 1% solution of diazo resin #4 (Fairmont Chemical Co.). The plate is exposed for 10 seconds on a Nu arc flip top exposure unit. The plate is developed by immersing it in a hot (50° C.) solution (5%) of SLS for 2 seconds. The plate is rinsed, dried, and ready for press.

EXAMPLE 5

A plate is coated, exposed and processed as in Example 3, except that the developer is acidified by adding 2.5 cc/liter of phosphoric acid. The plate is exposed a second time with similar results.

EXAMPLE 6

Two plates are coated as in Example 1. The plates are then exposed for 10 seconds. One plate is developed by hand using a sponge, and rubbing a 5% solution of SLS vigorously over the entire plate surface. After development the plate is rinsed thoroughly and dried. The second plate is developed by immersing the plate completely in a 5% solution of SLS for 10 seconds, rinsing, and drying. Both plates are now tested for background cleanliness by applying either lacquer or ink over the entire surface. This test should be repeated many times for statistical confirmation. It will be noted that invariably hand developed plate or plates developed via the application of pressure to the surface be it scrubbing, rubbing, or buffing will have undesirable background or scumming marks. Plates processed via immersion will invariably have clean backgrounds.

EXAMPLE 7

Two plates are coated as in Example 1. These plates are exposed for 10 seconds and one plate is spray developed with a 5% SLS and the other is developed by cascading SLS over the surface of the plate. In both instances clean, acceptable plates resulted.

What is claimed is:

1. Process for removing unexposed diazo from a lithographic printing plate comprising a silicated aluminum substrate having a hydrophilic, anionic, negatively charged surface and on and bonded to the substrate, a light sensitive, cationic, positively charged, water-soluble diazo material which has been selectively exposed to actinic light in an image area which comprises contacting the plate after exposure with a solution consisting essentially of an anionic material in water in a quantity and for a time sufficient to couple the diazo with the anionic material and dissolve the coupled product from the non-image area thereby overcoming the bond between the diazo and the substrate leaving a clean, hydrophilic non-image area.

2. Process of claim 1 wherein the plate after exposure is immersed in said solution.

3. Process of claim 1 wherein the exposed surface is flooded with said solution.

4. Process of claim 1 wherein said solution is at a temperature of from 18° to 90° C.

5. Process of claim 1 wherein the anionic material is selected from the group of alkali metal salts of alkylaryl sulfonates, alkali metal salts of alkyl sulfonates and alkali metal and ammonium salts of sulfated higher fatty alcohols.

6. Process for removing unexposed diazo from a lithographic printing plate consisting essentially of providing a silicated aluminum substrate having a hydrophilic, anionic, negatively charged surface and on and bonded to the substrate, a light sensitive coating consisting essentially of a cationic, positively charge, water-soluble diazo material which has been selectively exposed to actinic light in an image area, contacting the plate after exposure with a solution consisting essentially of an anionic material in water in a quantity and for a time sufficient to couple the diazo with the anionic material and dissolve the coupled product from the non-image area thereby overcoming the bond between the diazo and the substrate leaving a clean, hydrophilic non-image area and rinsing with water.

* * * * *